(12) United States Patent
Acum et al.

(10) Patent No.: US 7,422,772 B1
(45) Date of Patent: Sep. 9, 2008

(54) CONFORMAL COATING APPLICATOR AND METHOD

(75) Inventors: Howard Acum, Oxon (GB); Robert H. Hoffman, Carlsbad, CA (US); Jacques Mycke, Maastricht (NL); Todd Weston, Vista, CA (US)

(73) Assignee: Nordson Corporation, Westlake, OH (US)

( * ) Notice: Subject to any disclaimer, the term of this patent is extended or adjusted under 35 U.S.C. 154(b) by 294 days.

(21) Appl. No.: 11/330,502

(22) Filed: Jan. 12, 2006

Related U.S. Application Data

(62) Division of application No. 10/697,193, filed on Oct. 30, 2003, now Pat. No. 7,028,867.

(51) Int. Cl.
- B05D 1/02 (2006.01)
- B05D 5/00 (2006.01)
- B05B 7/10 (2006.01)

(52) U.S. Cl. .......... 427/421.1; 427/424; 427/427.3; 239/406; 239/421; 239/424; 239/424.5; 239/425

(58) Field of Classification Search .......... 427/424, 427/427.3, 421.1; 239/406, 421, 424, 424.5, 239/425
See application file for complete search history.

(56) References Cited

U.S. PATENT DOCUMENTS

| 721,900 | A | 3/1903 | Lassoe et al. |
|---|---|---|---|
| 1,633,291 | A | 6/1927 | Sausen et al. |
| 1,779,849 | A | 10/1930 | Lusk |
| 2,149,181 | A | 2/1939 | Krautzberger |
| 4,478,370 | A | 10/1984 | Hastings |
| 4,785,996 | A | 11/1988 | Ziecker et al. |
| 4,801,051 | A | 1/1989 | Lewis et al. |
| 4,815,660 | A | 3/1989 | Boger |
| 4,911,956 | A | 3/1990 | Gabryszewski et al. |
| 4,969,602 | A | 11/1990 | Scholl |
| 4,970,985 | A | 11/1990 | Slautterback |

(Continued)

FOREIGN PATENT DOCUMENTS

EP 0 609 478 A1 10/1994

(Continued)

OTHER PUBLICATIONS

Precision Valve & Automation, *Valves, Controllers, Tanks & Accessories, Manual Fluid Dispensing Systems*, Product Brochure, no data.

(Continued)

*Primary Examiner*—Timothy Meeks
*Assistant Examiner*—Jimmy Lin
(74) *Attorney, Agent, or Firm*—Wood, Herron & Evans, L.L.P.

(57) ABSTRACT

An applicator for dispensing a conformal coating material onto a substrate. The applicator has a body with a nozzle having a dispensing orifice at a distal end of the body, and assist air is supplied to a location adjacent the dispensing orifice. A seat is disposed in the nozzle around the dispensing orifice, and an end of a needle is movable into contact with and through the seat to terminate a flow of the coating material through the dispensing orifice and eliminate any coating material flow path downstream of the seat. A needle guide is used to laterally support the needle above the nozzle. The distal end of a nozzle is the distal end of the applicator and is exposed for cleaning.

12 Claims, 5 Drawing Sheets

U.S. PATENT DOCUMENTS

| | | |
|---|---|---|
| RE33,481 E | 12/1990 | Ziecker et al. |
| 5,052,338 A | 10/1991 | Maiorca et al. |
| 5,065,943 A | 11/1991 | Boger et al. |
| 5,114,752 A | 5/1992 | Hall |
| 5,141,165 A | 8/1992 | Sharpless et al. |
| 5,169,071 A | 12/1992 | Boger et al. |
| 5,186,982 A | 2/1993 | Blette et al. |
| 5,194,115 A | 3/1993 | Ramspeck et al. |
| 5,292,068 A | 3/1994 | Raterman et al. |
| 5,294,459 A | 3/1994 | Hogan et al. |
| 5,322,564 A | 6/1994 | Ludwig et al. |
| 5,431,343 A | 7/1995 | Kubiak et al. |
| 5,607,108 A | 3/1997 | Garlick et al. |
| 5,639,027 A | 6/1997 | Fritz |
| 5,747,102 A | 5/1998 | Smith et al. |
| 5,782,410 A | 7/1998 | Weston |
| 5,794,825 A | 8/1998 | Gordon et al. |
| 5,795,390 A | 8/1998 | Cavallaro |
| 5,819,983 A | 10/1998 | White et al. |
| 5,837,892 A | 11/1998 | Cavallaro et al. |
| 5,873,528 A | 2/1999 | Lewis et al. |
| 5,934,520 A | 8/1999 | Byerly et al. |
| 6,056,155 A | 5/2000 | Byerly et al. |
| 6,132,809 A | 10/2000 | Hynes et al. |
| 6,170,760 B1 | 1/2001 | Bievenue et al. |
| 6,196,521 B1 | 3/2001 | Hynes et al. |
| 6,325,853 B1 | 12/2001 | Hogan et al. |
| 6,447,847 B1 | 9/2002 | Hynes et al. |
| 6,523,757 B1 | 2/2003 | Bievenue et al. |

OTHER PUBLICATIONS

Asymtek®, a Nordson Company, *Selective Conformal Coating System, Century® C-740 System Specifications*, Published Jun. 2003.

Nordson Corporation, *Swirl Coat® Dispense Head, Swirl Coating Specifications*, May 1999.

CONFORMAL COATING APPLICATOR AND METHOD

This application is a divisional of application Ser. No. 10/697,193, filed on Oct. 30, 2003, now U.S. Pat. No. 7,028,867, the entirety of which is incorporated by reference herein.

FIELD OF THE INVENTION

The present invention generally relates to equipment for dispensing viscous materials and more particularly, to a dispenser for applying conformal coatings to electrical components.

BACKGROUND OF THE INVENTION

Conformal coating is the process of applying a dielectric material onto an electrical component, for example, a printed circuit ("PC") board or a device mounted thereon, to protect it from moisture, fungus, dust, corrosion, abrasion and other environmental stresses. Common conformal coating materials include silicone, acrylic, polyurethane, epoxy synthetic resins and various polymers. When applied to PC boards, an insulative resin film of uniform thickness is formed as a solvent evaporates or, as a solvent free material is cured. A conformal coating can be applied using a dipping process or an automated applicator. However, more current applications require that the conformal coating be applied to selected areas of the PC board and the components thereon in order to preserve electrical and/or heat conduction properties on specific uncoated areas. Further, different conformal coating materials may be required; and it is often desirable to apply the conformal coating materials in different patterns, for example, a straight bead, a bead that is continuously rotated in a curved or circular pattern, and/or a bead that is atomized.

Automated systems are known, which have one or several conformal coating dispensers mounted on a robotic system, wherein one dispenser applies a bead of the coating material; and another dispenser sprays the coating material. Thus, while the multiple dispensers are effective to selectively apply different conformal coating patterns, such a system has several disadvantages. The use of multiple dispensers increases the cost of, the payload on, and the size of, the robotic system, as well as the probability of equipment failure, thereby reducing the reliability of the system. Further, the use of multiple dispensers increases the processing cycle time by the time required to switch the coating process between the dispensers. In addition, multiple dispensers increase the wetted parts that must be cleaned and maintained. Therefore, it is desirable to be able to apply different patterns of coating material with a single dispenser.

Automated systems are also known in which a single conformal coating dispenser is mounted on a robotic system and is able to selectively apply a conformal coating material in different patterns, for example, a straight bead, a rotating bead or an atomized bead. However, such dispensers are relatively complex and require a relatively high level of maintenance in order to reliably apply different patterns of conformal coating materials. For example, known dispensers leave a small amount of conformal coating material in a nozzle path downstream of the dispensing valve after the dispensing valve is closed. As this material cures, it can adversely affect subsequent dispensing cycles. Alternatively, it may be necessary to remove the material via a purge cleaning cycle, or it may be necessary to disassemble the nozzle for a thorough cleaning. Any required cleaning reduces the productivity of the dispensing machine and the efficiency of the dispensing process.

For purposes of this document, the term "downstream" refers to a direction or location that follows a normal coating material flow through the applicator, that is, from a liquid inlet of the applicator toward the dispensing orifice. Likewise, "upstream" refers to a direction or location that is opposite a normal coating material flow through the applicator, that is, from the dispensing orifice toward the liquid inlet of the applicator. Also, for purposes of this document, the term "air assist" refers to the use of any gas, such as air or purified nitrogen to affect the shaping of the liquid fluid stream that is sprayed from the applicator.

Conformal coating materials range from solvent based materials that cure by evaporation of the solvent, to "100% solids" conformal coating materials that do not use a solvent and cure via cross-linking mechanism that may utilize exposure to air, moisture, ultraviolet light, etc. "100% solids" refers to the fact that nearly all of the admixture components in the liquid material are present in the cured material and there is no weight loss due to the evaporation of a solvent, although typically small quantities of diluents (less than 1% by weight) may be added that could evaporate or be consumed. With continuing efforts to reduce the amount of solvents that are used in conformal coating materials, the use of 100% solids conformal coating materials is increasing, for the benefit of reducing the consumption of volatile organic compounds (VOCs). Cleaning a dispenser nozzle that is coated with a 100% solids conformal coating material is more challenging because the 100% solids conformal coating material typically cannot be dissolved in a solvent. Further, with known conformal coating dispensers, the nozzle is recessed inside a cap or cylindrical bore at the end of the dispenser. The recessed nature of the nozzle makes cleaning more difficult and often requires that the cap and nozzle be removed for a thorough cleaning. Again, while the nozzle is being cleaned, the dispenser is turned off and out of production; and thus, the time required to clean the nozzle should be minimized. Therefore, there is a need for a conformal coating dispenser that minimizes the need for cleaning the nozzle and permits the cleaning process to be automated.

With known dispensers, during use, a small amount of conformal coating material accumulates on the external surface of the nozzle, which adversely affects the conformal coating process and must be removed by cleaning the nozzle's external surface. Therefore, there is a need to provide a conformal coating dispenser in which such accumulations of conformal coating material on the nozzle are minimized or eliminated.

Known dispensers that apply a conformal coating material in different patterns are limited in the number of conformal coating materials that can be dispensed without difficulty. Conformal coating materials often have material properties that require frequent operator intervention to manually service the applicator, for example, to clean or change the tip. Therefore, such dispensers cannot be applied in fully automatic dispensing cycles across a wide range of applications. Therefore, there is a need for a conformal coating dispenser that is more flexible and has the capability of providing a greater range of conformal coating materials in various dispensing patterns, while minimizing the number of times and length of time required for cleaning.

SUMMARY OF THE INVENTION

The present invention provides an improved conformal coating applicator that is operable to dispense a conformal coating material in a variety of selectable coating patterns. The conformal coating applicator of the present invention leaves no or minimal undispensed material downstream of a dispensing valve when the applicator is turned off, thereby improving the ability to handle environmentally sensitive materials. Further, the nozzle containing the seat can be automatically and/or manually cleaned without having to partially disassemble the nozzle, for example, by removing an air cap. The conformal coating applicator of the present invention has a more uniform and consistent shaping airflow around the nozzle, which results in more consistent and uniform dispensing patterns. The applicator further provides a greater range of dispensing patterns than was previously available. In addition, the conformal coating applicator of the present invention has a nozzle design that is less susceptible to accumulating coating material on an external surface of the nozzle. Finally, the applicator of the present invention has few parts and is simple to disassemble, clean and reassemble. The conformal coating applicator of the present invention is especially useful for quickly and reliably selectively applying different patterns of conformal coatings to electronic components, as well as applying 100% solids conformal coating materials.

According to the principles of the present invention and in accordance with the described embodiments, the invention provides an applicator for dispensing a coating material onto a substrate. The applicator has a body with a liquid flow passage receiving the coating material and a fluid passage receiving a pressurized fluid. A needle extends through the liquid flow passage, and a needle guide is mounted near the distal end of the body for aligning and laterally supporting the needle. A nozzle is mounted at the distal end of the body, and a nozzle distal end extends beyond other structure of the applicator. A cap mounted to the body surrounds the nozzle. The cap forms a fluid path with the nozzle that is contiguous with the fluid passage, and the fluid path has an outlet for discharging the pressurized fluid at the cap distal end. A dispensing orifice extends through a seat at the nozzle distal end, and one end of the needle is movable into contact with the seat and through the dispensing orifice to terminate a flow of the coating material through the dispensing orifice. Thus, there is no coating material flow path downstream of the seat, and the nozzle distal end is exposed for automated cleaning.

In another embodiment of the invention, the applicator is part of an apparatus having a valve actuator connected to the needle and a positioner supporting the applicator, which is operable to move the applicator with respect to the substrate. The apparatus further has a wiper actuator mounted on the positioner and a wiper connected to the wiper actuator. A programmable control is connected to the valve actuator, the wiper actuator and the positioner. The programmable control is operable under program control to move the wiper into contact with the nozzle distal end. With automated cleaning, the applicator is suitable for highly automated cycles of coating material deposition with a minimum of user intervention.

In a further embodiment of the invention, the apparatus includes a pressurized liquid supply connected to a liquid pressure regulator that provides a plurality of selectable coating material pressures. A pressurized fluid supply is connected to a fluid pressure regulator that provides a plurality of selectable fluid pressures, wherein at least one of the fluid pressures is a high fluid pressure greater than a pressure used for dispensing the coating material. The programmable control is also connected to the pressure regulators and is operable under program control to cause different patterns of coating material to be applied to the substrate. Each pattern of coating material is created by a combination of one of the plurality of selectable liquid pressures and one of the plurality of selectable fluid pressures. The program control being further operable to under program control to select the high fluid pressure to blow off the nozzle distal end.

In a still further embodiment of the invention, the applicator has an extension removably mounted to the body. The extension has an internal passage receiving the needle and the coating material, and the nozzle is mounted to a distal end of the extension. A cap is located around the extension and is removably mounted to the body. The cap and the extension form a fluid path therebetween contiguous with the fluid passage. An upper alignment guide is located in the fluid path near proximal ends of the extension and the cap and function to align the proximal ends of the extension and the cap. A lower alignment guide is located in the fluid path near distal ends of the extension and the cap and function to align the distal ends of the extension and the cap. In one aspect of this invention, the upper alignment guide has splines that extend radially inward from the cap; and the lower alignment guide has splines that extend radially outward from the extension. The coaxial alignment of the extension and cap provide a uniform fluid path therebetween that, in turn, provides a more consistent and uniform flow of the shaping air at the distal end of the nozzle.

In an aspect of this invention, with different extensions, the lengths of the splines of the lower alignment guide can be chosen to be either parallel or oblique to a centerline of the extension. Fluid flow channels are similarly parallel or oblique to the centerline and result in different applications of the assist air at the nozzle, thereby resulting in a variety of different dispensing patterns of the conformal coating material.

These and other objects and advantages of the present invention will become more readily apparent during the following detailed description taken in conjunction with the drawings herein.

DETAILED DESCRIPTION OF THE INVENTION

Figure 1:
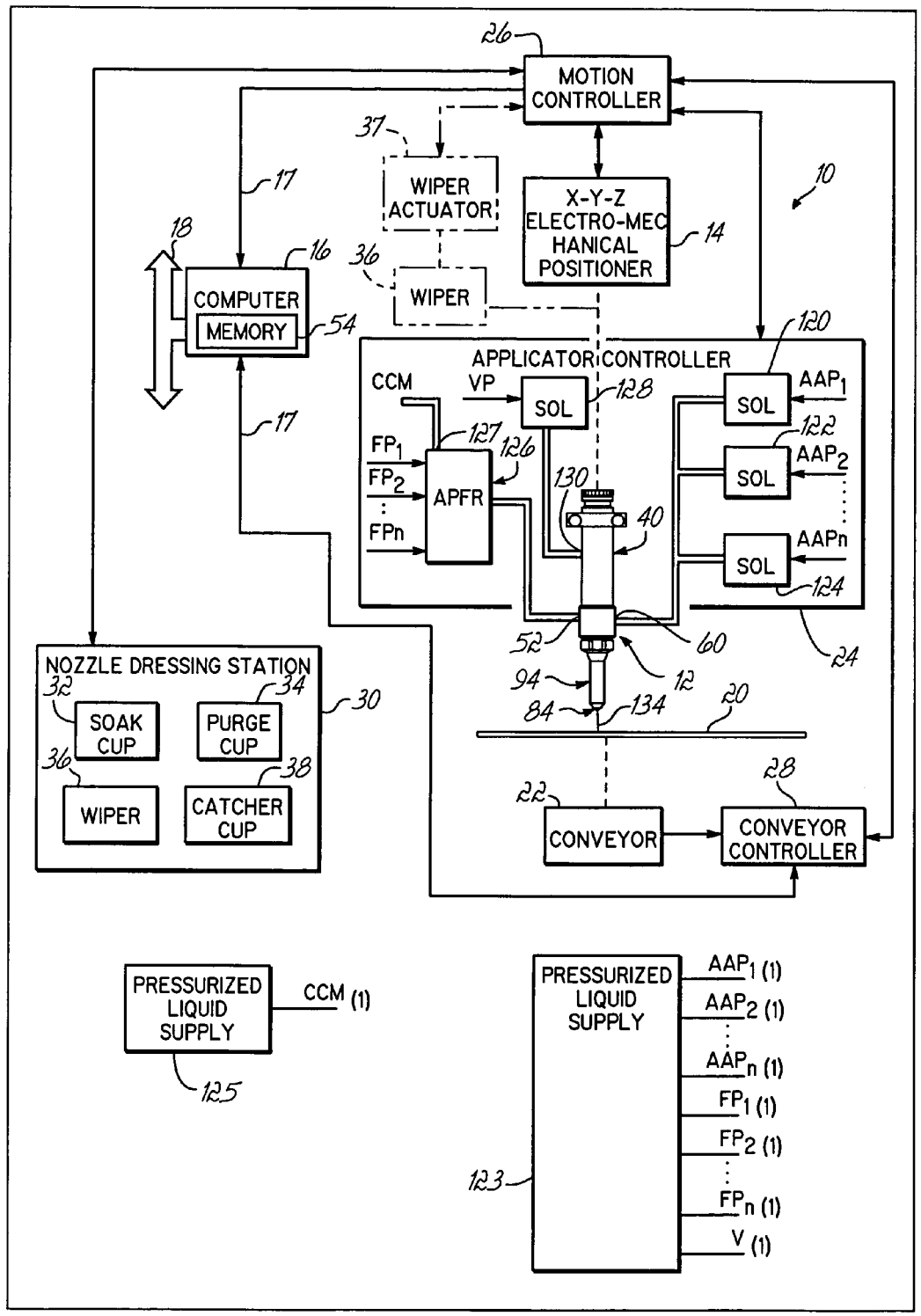
FIG. 1 is a schematic block diagram of the computer controlled conformal coating system in accordance with the principals of the present invention.

Referring to FIG. 1, a conforming coating applicator or dispenser 12 is suspended from an X-Y-Z positioner 14. The X-Y-Z electro-mechanical positioner 14 includes a drive coupled to independently controllable motors (not shown) in a known manner. The X-Y-Z positioner 14 is capable of rapidly moving the conformal coating applicator 12 with respect to a substrate 20.

A computer 16 may be a programmable logic controller ("PLC"), a microprocessor based controller, a hardened personal computer or other conventional control device capable of carrying out the functions described herein as will be understood by those of ordinary skill. A user I/O, for example, a video monitor (not shown) and keyboard (not shown) are connected to the computer 16 in a known manner. The coating system 10 is provided with standard RS-232 busses 17 and SMEMA CIM communications busses 18, which are compatible with most types of other automated equipment utilized in substrate production assembly lines.

Substrates 20, for example, PC boards, onto which conformal coatings are to be applied, are supported in an operative relationship with the applicator 12 in a known manner. Depending on the application, a number of substrates may be coated in a batch mode or continuously moved past the applicator 12 by an automatic conveyor 22. The conveyor 22 is of conventional design and has a width which can be adjusted to accept PC boards of different dimensions. The conveyor 22 may also include pneumatically operated lift and lock mechanisms. The conformal coating applicator 12 is operated by an applicator controller 24 that, in turn, receives command signals from a motion controller 26. The motion controller 26 and conveyor controller 28 are in electrical communications with the computer 16 and with each other. Thus, a system programmable control includes the computer 16, the motion controller 26, the applicator controller 24 and the conveyor controller 28, if used. This embodiment further includes a nozzle dressing station 30 that includes one or several soak cups 32, a purge cup 34, one or more wipers 36 and a catcher cup 38 and/or other nozzle dressing tools that can be used to clean the applicator tip depending on the specific properties of the conformal coating used.

Figure 2:
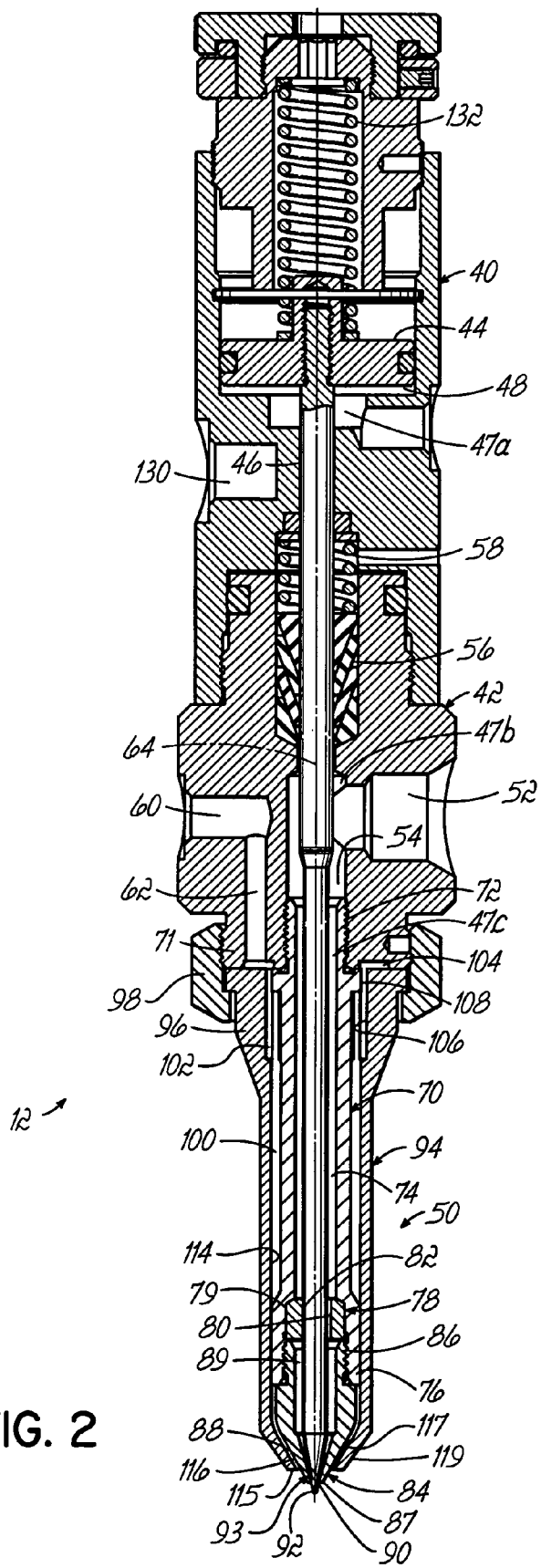
FIG. 2 is a centerline cross-sectional view of a conformal coating applicator used in the system of FIG. 1.

Referring to FIG. 2, the conformal coating applicator 12 has a main body comprised of an actuator or air cylinder body 40 that is rigidly connected to a liquid chamber body 42. A piston 44 is disposed within a cavity 48 of the air cylinder body 40. A needle 46 is threadedly mounted into the piston 48 and is disposed in contiguous cavities 47a, 47b, 47c that extend axially through the air cylinder body 40, the liquid chamber body 42 and valve extension 50, respectively.

A conformal coating material is supplied to the applicator 12 through a liquid inlet 52 that intersects the cavity 47b to form an annular liquid flow passage 54 around the needle 46 between the liquid inlet 52 and a distal end of the liquid chamber body 42. A packing material 56 provides a seal around the needle 46 and prevents the coating material from leaking past the needle 46 and out the upper end of the body 42. A compression spring 58 helps keep the packing material firmly compressed within the liquid chamber body 42. A fluid inlet 60 intersects a fluid or an assist air passage 62 that extends longitudinally within the liquid chamber body 42 adjacent the central cavity 54.

Referring to FIGS. 2, 2A, 2B and 3, the valve extension 50 has a fluid extension 70 that has a proximal end 72 threadedly connected to a distal end 71 of the liquid chamber body 42. The central axially extending cavity 47c in the valve extension 50 forms an annular liquid passage 74 around the needle 46 that is contiguous with the liquid flow passage 54 of the body 42. The fluid extension distal end 76 has internal threads that are substantially the same as the threads on the proximal end 72. A needle guide 78 has a circular exterior that concentrically locates the needle guide 78 with respect to an axial centerline 64 in a bore 79 of the fluid extension distal end 76. The needle 46 extends axially through the whole length of the internal passage 74 and through the needle guide 78. The needle guide 78 has axially extending internal channels 80 that provide liquid paths, which conduct the conformal coating material between the needle guide 78 and the needle 46. The internal channels 80 are separated by internal surfaces 82 that bound a circular cross-sectional area that is slightly larger than, or the same size as, the cross-sectional area of the needle 46. Therefore, the internal surfaces 82 function to hold the needle 46 in a substantially concentric or coaxial relationship with the distal end 76 of the fluid extension 70.

Figure 2A:
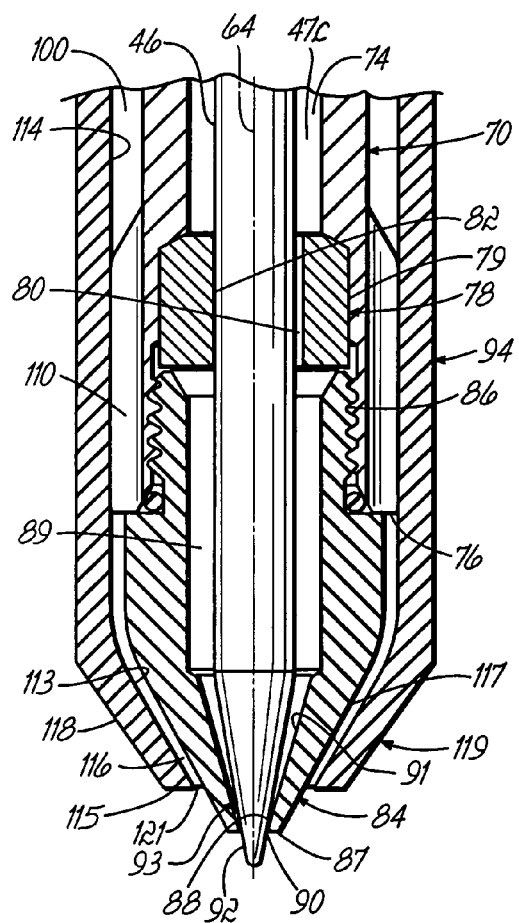
FIG. 2A is a larger centerline cross-sectional view of one end of a closed conformal coating applicator used in the system of FIG. 1.

A nozzle 84 has external threads 85 on its proximal end 86 that are used to mount the nozzle 84 into the fluid extension distal end 76. A distal end 87 of the nozzle 84 has a seat 88 with a dispensing orifice 90 extending therethrough. An axially extending central bore 89 is sized to receive the needle 46 and provide an annular material flow channel between the needle 46 and the nozzle 84. The needle 46 and valve seat 88 cooperate to form a dispensing valve 93. As shown in FIG. 2A, the downstream end of the central bore 89 has a taper 91 that permits a distal end 92 of the needle 46 to extend through the seat 88 and thus terminate a flow of conformal coating material through the applicator 12. There is no material flow cavity or path downstream of the dispensing valve 93; and when the applicator 12 is closed, there is minimal undispensed material left in a nozzle tip downstream of the valve 93, that is, only that which coats a small surface at the tip. Thus, the dispensing valve 93 is closed by the tapered needle 46 contacting and bearing against the seat 88, and the dispensing valve 93 is opened by the needle 46 being moved away from the seat 88, thereby permitting a flow of conformal coating material through the dispensing orifice 90.

The valve extension 50 further includes an air cap 94 that extends over the fluid extension 70 and has a proximal end 96 connected to the distal end 71 of the liquid chamber body 42 by a retaining nut 98. The air cap 94 has an axially extending bore 100 that receives the fluid extension 70 and provides an annular fluid or assist air path surrounding the fluid extension 70. Both ends of the air cap 94 are aligned with respective ends of the fluid extension 70. The concentricity of the air cap 94 with respect to the axial centerline 64 is maintained at its upper, proximal end 96 by an upper alignment guide 105 (FIG. 3) having splines 106 that extend into the bore 100 and contact an annular outer surface 108 of the fluid extension 70.

The clearances between the air cap 94 and retaining nut 98 are such that once concentricity with the fluid extension 70 is established, the retaining nut 98 is tightened to secure the air cap 94 to the liquid chamber body 42 without changing the concentricity. The splines 106 are separated by a plurality of axially extending channels or spaces 102 within the internal bore 100. The spaces 102 intersect and are contiguous with an annular assist air channel 104 in the fluid chamber distal end 71 that, in turn, intersects the assist air passage 62. The spaces 102 choke the flow of pressurized assist air from the channel 62 and facilitate a uniform distribution of the assist air around the fluid extension 70.

Figures 3, 4, 5:
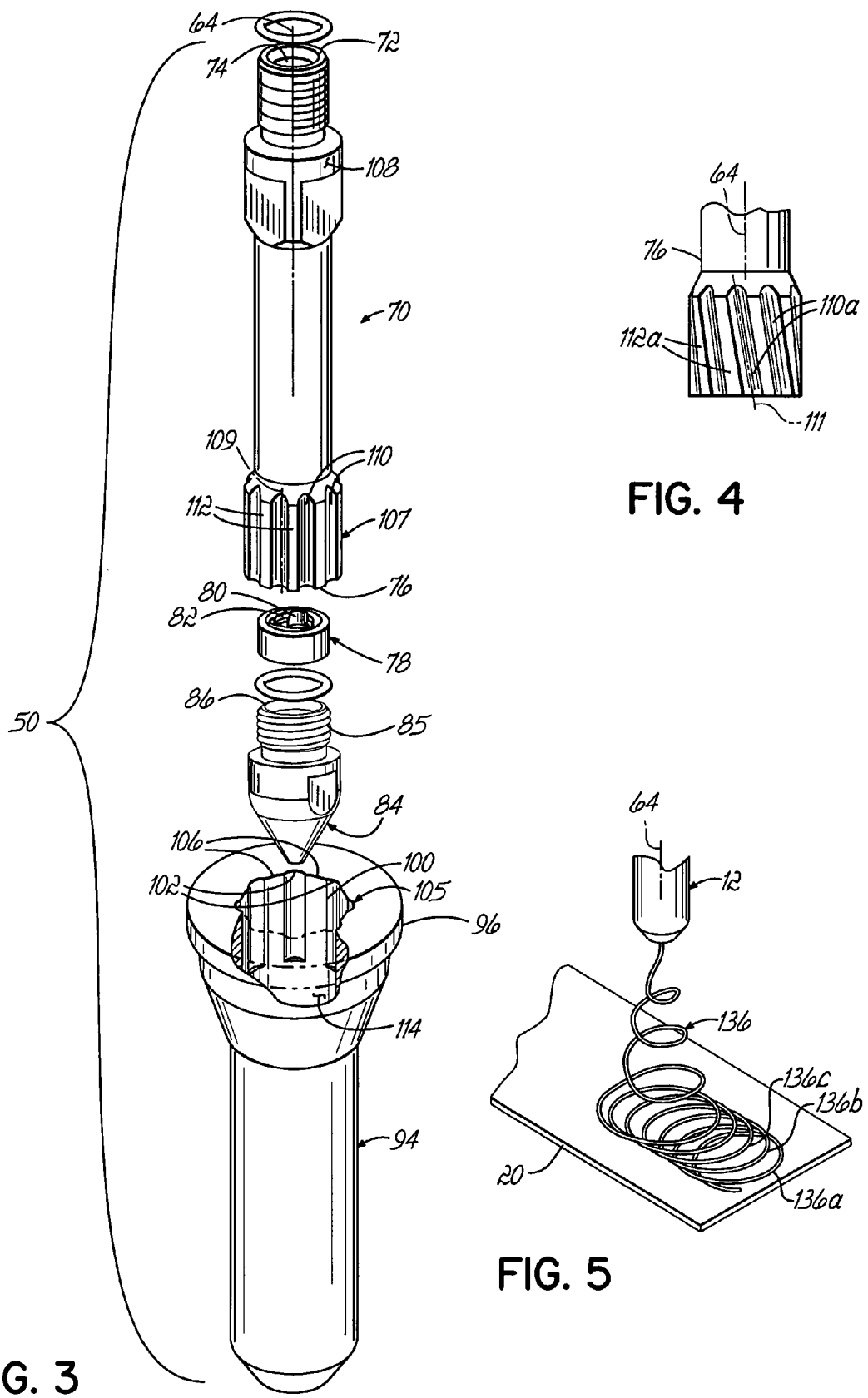
FIG. 3 is a disassembled partial view of the components forming the dispensing end of the applicator of FIG. 2.
FIG. 4 is a front elevation view of an alternative embodiment of a fluid extension illustrated in FIG. 3.
FIG. 5 is a schematic showing of a conformal coating material dispensing pattern using the fluid extension of FIG. 4.

Concentric alignment of the air cap distal end 115 with the fluid extension distal end 76 is maintained by a lower alignment guide 107 on a downstream end of the fluid extension 70. The lower alignment guide 107 has a plurality of splines 112 that bear against an inner bore wall 114 of the air cap 94. A plurality of circumferentially spaced axially extending channels or spaces 110 provide assist airflow paths at the fluid extension distal end 76. The fluid extension 70 can have nonangled splines 112 as shown in FIG. 3 that have respective lengths 109 parallel to the axial centerline 64. Alternatively, the fluid extension 70 can have angled splines 112a and separating channels or spaces 110a as shown in FIG. 4 that have respective lengths 111 oblique to the axial centerline 64. The angle of the splines 112a and spaces 110a is measured with respect to the axial centerline 64.

An annular assist air outlet passage 116 functions to diffuse the assist air and extends between a tapered portion 117 of the nozzle 84 near its distal end 87 and a tapered portion 119 of the air cap 94 near its distal end 115. The assist air outlet passage terminates in an annular, circular outlet 121 that projects the assist air past the nozzle distal end 87 and against a stream of conformal coating material being dispensed from the applicator 12.

In this embodiment, a pressurized fluid supply 123 provides a plurality of different regulated fluid pressures, for example, assist air pressures $AAP_1$, $AAP_2$, $AAP_n$, to respective solenoids 120, 122, 124. The solenoids 120-124 are fluidly connected to the fluid input 60. The solenoids 120-124 are mounted on the applicator 12 to provide a short assist air path and hence, a fast response to changes in assist air pressure. As will be appreciated, in an alternative embodiment, a programmable regulator can be used in place of the solenoids 120-124.

The pressurized fluid supply 123 also provides a plurality of different regulated fluid pressures, for example, air pressures $FP_1$, $FP_2$, $FP_n$, to an air piloted fluid regulator 126 that is mounted on the positioner 14 and does not move with the applicator 12. A pressurized liquid supply 125 provides conformal coating material under pressure to an input 127 of the regulator 126, and the regulator provides the conformal coating material to the liquid inlet 52 at a liquid pressure corresponding to a selected one of the air pressures $FP_1$, $FP_2$, $FP_n$. As will be subsequently described, most of the air pressures are used in the dispensing of the conformal coating material. However, in this embodiment, at least one of the air pressures is a high pressure that exceeds a pressure used for dispensing the conformal coating material. The pressurized fluid supply 123 further provides a further fluid pressure, for example, a regulated valve air pressure VP, to a valve solenoid 128 that upon actuation supplies the valve air pressure to an inlet 130 on the applicator 12 to open the dispensing valve 93. The valve solenoid 128 is also mounted on the applicator 12.

In operation, referring to FIG. 1, a disk or a computer integrated manufacturing controller (not shown) provides data representing a desired dispensing cycle to the computer 16 that, in turn, communicates control signals to the motion controller 26. The motion controller 26 commands the X-Y-Z positioner 14 to move the applicator 12 to desired locations with respect to the substrate 20. At any particular location, the motion controller 26 also provides a command signal to one of the solenoids 120-124 to select a desired assist air pressure and another command signal to the regulator 126 to select a fluid pressure that corresponds to a desired liquid pressure. The timing of both the air and liquid command signals are independently chosen with respect to the motion and valve timings so as to effect the correct spray pattern in the correct places. The combination of the desired assist air and liquid pressures causes the applicator 12 to dispense the conformal coating material in a desired pattern. The motion controller 26 simultaneously provides command signals to the positioner 14 to initiate applicator 12 motion and to the solenoid 128 causing it to change state. Upon the solenoid 128 changing state, the valve air pressure causes the piston 44 and needle 46 to overcome the biasing force of the piston return spring 132 and move vertically upward as viewed in FIG. 2. That motion displaces the needle 46 away from the seat 88, thereby opening the dispensing valve 93 and permitting a conformal coating material to flow through the liquid flow passage 54, the internal passage 74 and out the dispensing orifice 90. Upon the motion controller 26 subsequently changing the state of the valve command signal, the solenoid 128 switches back to its original state; and the valve air pressure is removed from the inlet 130. The piston return spring 132 moves the piston 44 and needle 46 vertically downward until the needle 46 engages the seat 88, thereby closing the dispensing valve 93 and terminating the flow of conformal coating material through the dispensing orifice 90.

The applicator 12 has great flexibility in providing a wide range of dispensing patterns as well as more capability in adjusting any selected pattern. To initiate a bead mode, the computer 16 provides signals to the motion controller 26 causing the motion controller to operate the solenoids 120-124, so that the assist air pressure is turned off. The computer 16 provides further signals to the motion controller 26 causing the motion controller 26 to provide command signals to the regulator 126 that select a fluid pressure resulting in a medium to high liquid pressure, for example, in a range of about 10-60 pounds per square inch ("psi"). That results in the applicator 12 dispensing a conformal coating material bead 134 through the nozzle 84 as shown in FIG. 1. The exact value of liquid pressure is application dependent and further depends on the desired flowrate of the conformal coating material. The flowrate is influenced by the liquid pressure, the diameter of the dispensing nozzle, the stroke of the needle, the relative velocity between the applicator and the substrate, the material viscosity, etc.

Dispensing a bead provides excellent edge definition and a relatively thick film build. A bead of conformal coating material is typically used to apply extra material along a component or connector edge, or to provide a picture frame around an area of coating. After dispensing a bead, assist air can be turned on to push material under tall components such as connectors, relays or transformers. A short duration bead in a stationary location produces a spot of material excellent for coating single points close to keep-out areas, that is, areas that are to be free of coating material. The zero-cavity design of the nozzle 84 substantially reduces drooling and stringing after the valve closes, thereby substantially improving dispensing accuracy.

In a rotational monofilament mode, a fluid extension 70 having the angled splines 112a shown in FIG. 4 is used. A single strand of dispensed material, that is, a monofilament, is spun on its axis by the shaping assist air as the monofilament exits the nozzle 84. As the monofilament spins away from the nozzle 84, it stretches and forms a conical shaped looping pattern 136 as shown in FIG. 5. The liquid pressure is about the same as in the bead mode, and the shape of the pattern of the monofilament is dependent on several factors, for example, the flowrate of assist air intersecting the dispensed monofilament as it leaves the dispensing orifice 90, the angle of the splines 112*a*, etc. Thus, in this mode, the computer 16 provides signals to the motion controller causing it to operate the solenoids 120-124, so that assist airflow is added around the dispensed monofilament. This assist air causes the monofilament to rotate or swirl about a centerline of the dispensing orifice 90 with an increasing radius as the monofilament drops toward the substrate, thereby forming the cone shaped pattern 136 shown in FIG. 5.

If there is no relative motion between the applicator 12 and the substrate 30, the monofilament is deposited in a circular pile on the substrate 20. However, the computer 16 often provides signals to the motion controller 26 causing it to command the positioner 14 to move the applicator 12 with respect to the substrate 20. The magnitude of the relative velocity between the applicator 12 and the substrate 20 controls the spacing of successive material depositions 136*a*, 136*b*, 136*c*. A relative velocity can be determined which results in each monofilament circle of conformal coating material being deposited immediately adjacent another monofilament of conformal coating material to form a film of conformal coating material on the substrate 20. As the relative velocity increases, a deposition pattern as shown in FIG. 5 is created in which there are spaces between the successive depositions 136*a*, 136*b*, 136*c* of conformal coating material deposited on the substrate 20.

Figure 6:
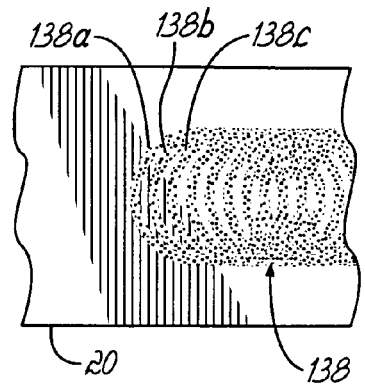
FIG. 6 is a schematic showing of a conformal coating material dispensing pattern using the fluid extension of FIG. 4 with a larger flow of shaping air than that used with the pattern of FIG. 5.
Figure 7:
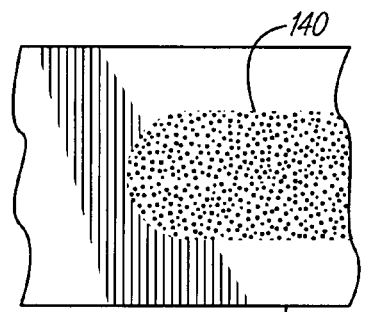
FIG. 7 is a schematic showing of a conformal coating material dispensing pattern using the fluid extension of FIG. 4 with a larger flow of shaping air than that used with the pattern of FIG. 6.

The width or angle of the conical pattern with respect to the centerline 64 is dependent on the angle of the spaces 110*a*, the assist air pressure and the assist airflow rate and the fluid flow properties. The width of the pattern of the rotating monofilament dispensed on the substrate is determined by the diameter of the cone upon it striking the substrate, and is thus influenced by the distance of the dispensing orifice 90 above the substrate 20. In this mode, the computer 16 provides signals to the motion controller 26 causing it to operate the solenoids 120-124, so that the pressure of the assist airflow is increased. As the assist air pressure increases, the rotating monofilament begins to break up and is deposited on the substrate in a pattern of circular spatters 138 as shown in FIG. 6. Typically this dispensing pattern results in a thinner coating layer with poorer edge definition. Again, the spacing between successive depositions 138*a*, 138*b*, and 138*c* of conformal coating material is controllable by the relative velocity between the applicator and the substrate 20. If the computer 16 provides signals to the motion controller 26 causing it to operate the solenoids 120-124, so that the pressure of the assist airflow is increased further, the spatter particles become smaller and more numerous until they resemble atomized particles 140 as shown in FIG. 7. The angle of the spaces 110*a* has a range of about 0-30 degrees or more depending on the application. The larger the angle, the larger the cone angle, however, the cone angle size is often determined and limited by the sizes of the areas in which a conformal coating is to be avoided. In practice, the angle of the spaces and the assist air pressure used is application dependent and for any particular application, are determined experimentally. The monofilament mode provides excellent uniformity in building layers of conformal coating material, overspray control and excellent edge definition.

Figure 8:
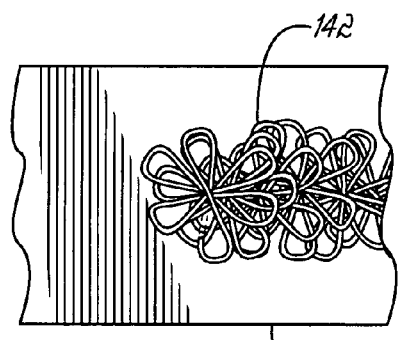
FIG. 8 is a schematic showing of a conformal coating material dispensing pattern using the fluid extension of FIG. 3 with a flow of shaping air similar to that used with the pattern of FIG. 5.

In a randomized monofilament mode, a different pattern of dispensed conformal coating material can be achieved by using a fluid extension 70 having non-angled spaces 110 as shown in FIG. 3. The liquid pressure is about the same as in the bead mode, and the pattern of the monofilament is dependent on the flowrate of assist air intersecting the monofilament as it leaves the dispensing orifice 90. With the non-angled spaces 110, the computer 16 causes the motion controller 26 to operate the solenoids 120-124 and add assist air at a flow and pressure around the monofilament, which causes the monofilament to randomly deposit a scribble pattern 142 on the substrate 20 that is generally contained in a circular boundary as shown in FIG. 8. As described with respect to the rotational monofilament, increasing the assist airflow and pressure in the randomized monofilament mode breaks up the rotating monofilament resulting in a deposited pattern of circular spatters similar to that shown in FIG. 6. Further increases in the assist airflow and pressure cause the spatter particles to become smaller and more numerous until they resemble atomized particles as shown in FIG. 7. Again, the desired assist airflow is application dependent and for any particular application, is determined experimentally.

In both the rotational and randomized filament modes, as the assist airflow increases, the diameter of the spray pattern increases as does the velocity of the material in the axial downward direction. Either affect may dominate depending on conditions. However, it has been observed that edge definition is best using the rotational monofilament mode, but the cross-section of the material laid down may have two peaks where adjacent loops of material overlap, which are often referred to as railroad tracks. In the randomized monofilament mode, the dispensed pattern is often narrower with a cross-section characterized by a single peak in the middle or with no peak but with a relatively uniform cross-section or thickness out to the edges where it tapers off. Thus, it appears that the randomized monofilament is more sensitive to higher or lower assist airflows, which may degrade the edge definition but provide a narrower pattern with a cross-section having a more uniform thickness across the pattern. Again, the desirability of using the randomized monofilament mode is determined experimentally.

A common problem with applicators is that during use a small amount of conformal coating material can accumulate on the exterior surface of the nozzle 84. This results from a wetting of the external surface near the dispensing orifice 90 depending on the conformal coating material properties including flow properties and the geometry of the dispensing orifice 90 and nozzle distal end 87. Such an accumulation can cause the bead or stream of conformal coating material to bend or distort when it is initially discharged from the dispensing orifice 90, which degrades the edge definition and/or placement of the initial bead. With many existing applicator designs, the nozzle is recessed inside a cap or cylindrical bore, which makes automated cleaning of the nozzle difficult; however, the exposed nozzle distal end 87 of the applicator 12 provides greater opportunities to automatically and effectively clean the nozzle. The nature of a cleaning cycle will depend on the application and the conformal coating material being used.

In one example, the external accumulation of conformal coating material on the nozzle 84 can be automatically removed by a first cleaning cycle, wherein the motion controller 26 commands the positioner 14 to move the applicator 12 over a soak cup 32 that contains a conformal coating material solvent. The motion controller 26 then commands the positioner to dip the nozzle distal end 87 into the soak cup 32 for a period of time sufficient to soften the material. Thereafter, the motion controller 26 commands the positioner 14 to move the applicator 12 over the dressing station 30. The positioner 14 then moves the nozzle distal end 87 into contact with one or more of the wipers 36 in an attempt to wipe the accumulation of conformal coating material off of the external surface of the nozzle 84. The wipers 36 may include a brush, a squeegee blade, a rubber boot, a compliant material or some other device that can be used to physically wipe external surfaces around the nozzle distal end 87. Using a wiping device to clean the nozzle distal end 87 is often effective. However, sometimes the wiping device smears the coating material; and at other times, conformal coating material accumulates on the wiping device, which requires manual cleaning.

Depending on the application and the conformal coating material being used, a high pressure air blast may be used to clean the external accumulation of conformal coating material from the nozzle 84. With this cleaning cycle, the computer 16 provides signals to the motion controller 26 causing it to command a series of steps. The motion controller 26 first commands the positioner 14 to move the applicator over the soak cup 32 and then dip the nozzle distal end 87 into the soak cup 32 for a period of time to soften the accumulation of material. Thereafter, the motion controller 26 commands the positioner 14 to move the applicator 12 over a catcher cup 38. The catcher cup utilizes any material that can be used to catch a glob of conformal coating material being discharged from the nozzle distal end 87, for example, a cloth, a tissue, etc. The motion controller 26 then operates one of the solenoids 120-124 having the highest assist air pressure, that is, a fluid pressure greater than a pressure used for dispensing the conformal coating material, for example, a pressure in a range of about 5-90 psi. Such a high pressure is often the maximum pressure available, however, the flow must not so great as to blow material out of the catcher and into the work envelope of the coating system. The resulting blast of high pressure assist air blows the softened accumulation of the conformal coating material off of the nozzle distal end 87 and into the catcher cup 38.

As will be appreciated, with 100% solids conformal coating materials, the blast of high pressure air can be used to blow off or clean the nozzle distal end 87 without first dipping the nozzle distal end 87 in the soak cup 32. In a further embodiment, an intermediate step of wiping after the soak but before the blast is optionally effective depending on the application and fluid. For example, 100% solids conformal coating made from silicone formulations are known to have few effective and safe solvents. The solvents that are typically offered as safe and cost effective serve to soften the accumulated material but not to dissolve it completely. Mechanical agitation serves to further loosen the accumulated material, but the material has a tendency to cling to both the wiped surface and the wiper, and a subsequent blast of air serves to more completely remove the accumulated material.

The susceptibility of the nozzle 84 to hold an accumulation of the conformal coating material is reduced by producing a nozzle outer surface that is very smooth and coated with a material that inhibits an accumulation and adhesion of the coating material. For example, the nozzle outer surface is finished or polished smooth by electro-polishing, burnishing, lapping or other finishing process. Thereafter, the nozzle outer surface is coated with a material that resists an accumulation of the conformal coating, for example, nickel, a nickel impregnated with a "TEFLON" polytetrafluoroethylene material. Alternatively, the nozzle outer surface may be waxed or coated with a hard plastic material. Or, the nozzle may be made with a hard plastic material. Thus, the small accumulation of conformal coating material is resisted by the design of the nozzle shape and finish. It is believed that any residual accumulations can be removed by periodic automated cleaning as described above, thereby improving the conformal coating material dispensing process.

Another common problem with applicators is that a lack of a concentric alignment of the needle 46 within the dispensing orifice 90 can also cause the bead or stream of conformal coating material to bend or distort when it is initially discharged from the dispensing orifice 90. The needle guide 78 maintains the needle 46 coaxial with the dispensing orifice 90 and thus, helps prevent any initial bending of the bead.

Figure 2B:
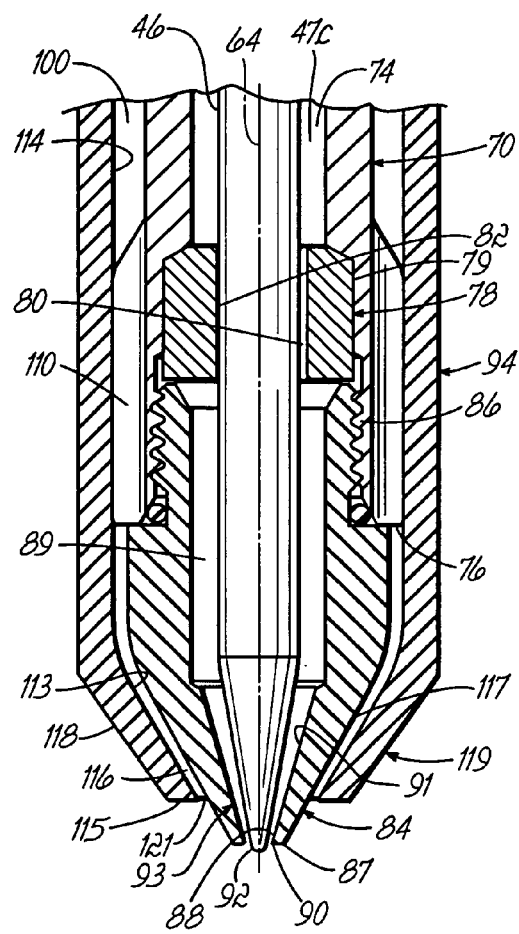
FIG. 2B is a centerline cross-sectional view illustrating one embodiment of an open conformal coating applicator used in the system of FIG. 1.

In some applications, the ability of the applicator 12 to maintain a linear bead of conformal coating material as it is dispensed through the dispensing orifice 90 can be improved by maintaining the end of the needle 46 in the dispensing orifice 90 during the dispensing process. For example, as shown in FIG. 2A, when the applicator 12 is closed, the distal end 92 of the needle 46 extends completely through the dispensing orifice 90. In this embodiment, as shown in FIG. 2B, when the needle 46 is moved vertically upward to open the dispensing valve 93, the distal end 92 of the needle 46 remains disposed through the dispensing orifice 90. Thus, the distal end 92 helps guide the bead of conformal coating material linearly through the dispensing orifice 90, thereby minimizing the tendency of the bead to bend or distort as it is discharged from the dispensing orifice 90.

In use, the capability of the applicator 12 to be automatically cleaned allows the applicator to automatically dispense a wide range of conformal coating materials. Further, the capability of having greater ranges of program selectable liquid pressures of the conformal coating material and program selectable fluid pressures of the assist air provides a wide range of conformal coating patterns to be accurately and repeatedly deposited on a substrate. In addition, the capability of providing a fluid extension 70 with spaces of different angles further adds to the versatility of the applicator 12. It is an increasingly common requirement that a conformal coating material be precisely applied to one or more particular areas of a substrate. The ability to control the precise location of a conformal coating material can to some extent limit the density of components on the substrate. It is also often a requirement that different conformal coating materials be selectively applied to different areas of the substrate. Thus, the capability of providing a range of automatically controllable deposition patterns and automatically cleaning the nozzle distal end 87 as desired is especially important.

In preparing an operational program to be stored in the computer 16, in some applications, a user provides inputs to the computer 16 that cause the motion controller 26 to move the applicator 12 while operating the conformal coating pressure regulator 126 and the solenoids 120-124, so that a desired pattern of conformal coating material is provided by the applicator 12. Thus, test coatings are deposited on a sample substrate until the desired conformal coating is achieved. The various parameters, for example, the identity of the substrate, the identity of the conformal coating material, the liquid pressure, the assist air pressure, the velocity of the applicator, the distance of the applicator from the substrate, the diameter of the dispensing orifice, the initial position of the needle, etc., that were used to achieve the desired coating are stored in a memory 54 of the computer 16 for subsequent use. Further, depending on the conformal coating material being used, prior to the start of a conformal coating application cycle, it may be desired to clean the nozzle 84. Again, the user provides commands to the computer 16 that cause the motion controller 26 to move the applicator 12 to the nozzle dressing station 30 and through one or more nozzle cleaning cycles until the most effective cleaning cycle is determined. Again, parameters identifying and executing that cleaning cycle are stored in the memory 54 of the computer 16 for future use.

As will be appreciated, a library of operational cycles or sequences can be accumulated and stored in the computer 16 and/or other computers. Further, those operational sequences can be recalled and placed in a particular operational program as desired, and they can be further tuned to accommodate different environmental conditions, different substrates or different conformal coating material. In addition, during operation, the computer 16 can transfer a whole operational program to the motion controller 26 for execution, or the computer 16 can transfer one or more instructions in a batch of instructions and data to the motion controller 26 for execution. The net result is that the improved ability to automatically clean the nozzle 84 and automatically provide a wide range of dispensing patterns permits a more fully automated dispensing of conformal coating materials than was heretofore possible.

The structure of the applicator 12 provides numerous advantages over known conformal coating applicators. First, the seat 88 is at the nozzle distal end 87; and the needle distal end 92 extends through the valve seat 88. Thus, there is no material flow cavity or path downstream of the valve seat 88; and when the applicator 12 is closed, there is minimal undispensed material left in a nozzle tip downstream of the valve seat 88, that is, only that which coats a small surface at the tip. This zero cavity design eliminates any opportunity for undispensed material to accumulate at a location downstream of the valve seat 88. Thus, the requirement for using a purge cycle to clean out the applicator 12 is substantially reduced, as is the wetted area at the distal end of the applicator 12.

A second advantage of the applicator 12 is provided by the nozzle distal end 87 and valve seat 88 extending beyond, and being downstream of, the distal end 115 of the air cap 94. This exposure of the nozzle distal end 87 and seat 88 facilitates both visual nozzle inspection and manual and/or automated cleaning. Further, it is not necessary to remove any part prior to initiating a cleaning operation as is common with many known dispensers.

A further advantage is provided by the nozzle 84 and air cap 94 being relatively thin and having respective tapers 117, 119 at their respective downstream ends. The air cap taper 119 has a conical cross-section profile formed by a conical and tapered inner surface 113 and a conical and tapered outer surface 118, thereby allowing the air cap 94 access to tight and hard to reach locations. In addition, during the deposition process, assist air currents can bounce off of the substrate and be reflected back toward the nozzle 84; however, the thin and tapered design deflects those reflected assist air currents away from the nozzle distal end 87 and air cap distal end 115. The thin and tapered design also minimizes an accumulation of atomized droplets of conformal coating material on the nozzle that bounce back from the substrate toward the nozzle. Further, the air cap taper 119 places the air cap orifice 121 further downstream than other structure of the air cap 94 and thus, facilitates automated cleaning of the air cap distal end 115 and orifice 121.

The fluid extension splines 112 and the air cap splines 106 cooperate to provide additional advantages. First, the air cap splines 106 coaxially align the proximal end of the air cap with the proximal end of the fluid extension, and the splines 112 of the fluid extension 70 coaxially align the distal end of the air cap with the fluid extension distal end 76. The coaxial alignment of the air cap 94 with the fluid extension 70 provides a more consistent and uniform flow of assist air therebetween. Second, the outward facing orientation of the fluid extension splines 112 greatly facilitates cleaning of the spaces 110 when required. Third, the use of the needle guide 78 provides a coaxial alignment of the needle 46 with the fluid extension 70 and prevents the needle 46 from oscillating or vibrating during use. Maintaining the needle 46 coaxially aligned provides a more consistent and uniform flow of material around the needle 46 and through the dispensing orifice 90 in the downstream axial direction, thereby providing a more consistent and uniform dispensing pattern of the conformal coating material. Without the needle guide 78, any misalignment that can deflect the needle 46 from a coaxial alignment with the dispensing orifice 90 may cause the material flow to have eddies that result in a fluid stream that is not perfectly axially directed.

Figure 9:
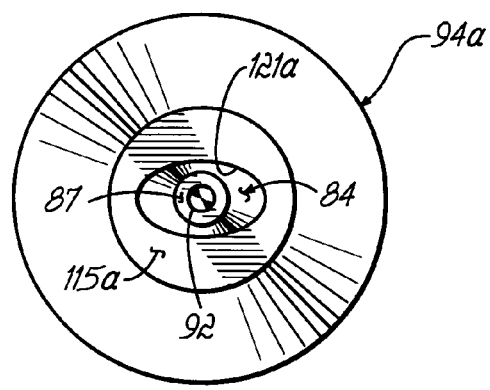
FIG. 9 is an end view of an applicator having an alternative elliptical fluid orifice that may be used in the system of FIG. 1.

While the invention has been illustrated by the description of one embodiment and while the embodiment has been described in considerable detail, there is no intention to restrict, nor in any way limit the scope of the appended claims to such detail. Additional advantages and modifications will readily appear to those who are skilled in the art. For example, in the described embodiment with respect to FIG. 2A, the air cap distal end 115 has a circular opening 121 that has a generally circular bead dispensing pattern as shown in FIG. 5. As will be appreciated, in an alternative embodiment, the opening 121 of the air cap 94 can have other shapes to provide other dispensing patterns of conformal coating materials. For example, as shown in FIG. 9, the opening 121a of a distal end 115a of an air cap 94a can be elliptically shaped to provide higher concentrations of assist air pressure on opposite sides of the nozzle 84.

Figure 10A:
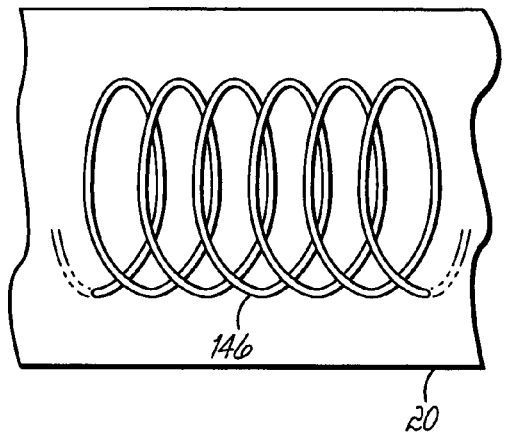
FIG. 10A is a schematic showing of one conformal coating material dispensing pattern using the alternative elliptical orifice of FIG. 9 and a first flow of shaping air.

At a lower value of assist air pressure that is often determined experimentally, the assist air causes the bead to form an elliptical deposition pattern 146 as shown in FIG. 10A. It should be noted that with respect to the elliptical shape of the air cap opening, the major axis of the ellipse of the air cap has the greater openings and thus the greater air flow, resulting in a squeezing down of the circular monofilament and a resultant elliptical spray pattern whose major axis is perpendicular to that of the opening.

Figure 10B:
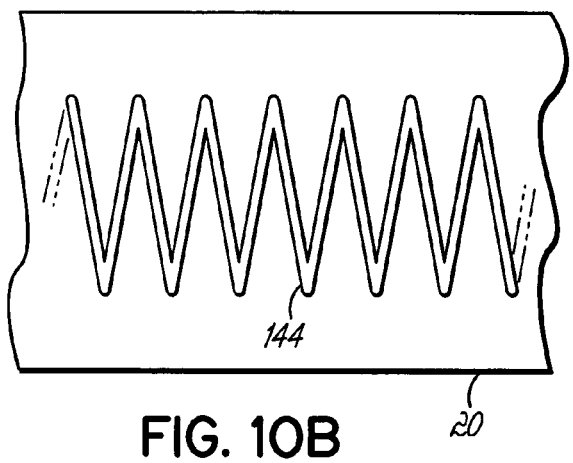
FIG. 10B is a schematic showing of another conformal coating material dispensing pattern using the alternative elliptical orifice of FIG. 9 and a second flow of shaping air to create a more elongated elliptical shape to effect a greater major axis and a lesser minor axis to the elliptical spray of FIG. 10A.

As the assist air pressure is increased or as the geometry serves to provide more air flow along the air cap ellipse major axis and less along the ellipse minor axis, oscillating, generally straight lines 144 of conformal coating material are deposited on the substrate 20 in a "waggle" pattern, as shown in FIG. 10B. As will be appreciated, the spacing between the lines 144 of deposited material in the waggle pattern of FIG. 10B is determined by the magnitude of relative motion between the applicator and the substrate 20. By increasing the magnitude of the assist air pressure, the elliptical monofilaments of FIG. 10A or the oscillating straight line waggle pattern of FIG. 10B changes into a spattered and atomized patterns as previously described with respect to FIGS. 6 and 7.

Figure 11:
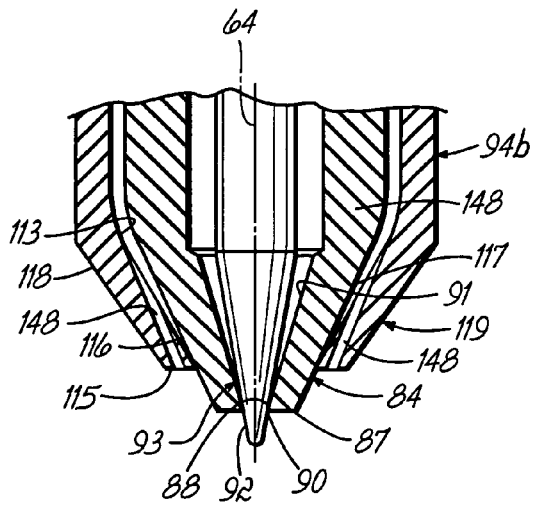
FIG. 11 is a centerline cross-sectional view illustrating another embodiment of a conformal coating applicator that may be used in the system of FIG. 1, which provides conformal coating material dispensing patterns shown in FIGS. 10A and 10B.

In a further alternative embodiment shown in FIG. 11, the deposition patterns of FIG. 10A can be achieved by an air cap 94b that has a distal end closed against the nozzle 84. The air cap 94b has diametrically opposed assist air outlets 148 to provide higher concentrations of assist air pressure on opposite sides of the nozzle 84. As will be appreciated, by rotating the air caps 94a, 94b by 90 degrees, the direction of the oscillation of the deposition pattern can be changed with respect to a direction of relative motion between the applicator 12 and the substrate 20. The advantage of an elliptical or straight line waggle pattern is that the resulting stripe ends are better squared off, thereby potentially eliminating the need for a subsequent "clean-up" stripe directed perpendicular to, and along the ends of, a series of adjacent stripes coating an area.

In the described embodiment, the splines 106 extend radially inward from the air cap 94. As will be appreciated, in an alternative embodiment, the splines 106 can extend radially outward from the fluid extension 70 in a manner similar to the splines 112. In this embodiment, the splines 106 replace, and can be used for the same purpose as, the flat surfaces shown in FIG. 3 at the proximal end of the fluid extension 70, which provide a grip for a wrench. In a further alternative embodiment, the splines 112 can extend radially inward from the air cap 94 instead of radially outward from the fluid extension 70; however, in that embodiment, the advantage of their ease of cleaning is lost.

In the embodiment of FIG. 2A, the needle distal end is shown as extending fully through the dispensing orifice 90 when the dispensing valve 93 is closed. As will be appreciated, in alternative embodiments, the dispensing orifice 90 can be made a radius that is substantially equal to the radius of the needle distal end 93. Therefore, when the dispensing valve is closed, the needle distal end extends into, but not past, the dispensing orifice 90; and there is still no path or place for conformal coating material to remain in the applicator 12 when the dispensing valve is closed.

In the described embodiment, the wiper 36 is part of a nozzle dressing station that is mounted adjacent the positioner 14. As will be appreciated, in an alternative embodiment, as shown in phantom in FIG. 1, the wiper 36 is mounted on the positioner 14 and has a wiper actuator 37, for example, a cylinder or electric motor, that is controllable by the motion controller 26. The wiper 36 and wiper actuator 37 are mounted with respect to the nozzle 84, such that operation of the wiper actuator 37 causes the wiper 36 to contact the nozzle distal end 87, thereby removing conformal coating material therefrom. With this embodiment, the computer 16 and/or the motion controller 26 are programmable to operate the wiper actuator 37 at the appropriate time during the conformal coating dispensing cycle.

In a further alternative embodiment, the wiper 36 may be a material used with the catcher cup 38, that is, any material that can be used to catch a glob of conformal coating material being discharged from the nozzle distal end 87, for example, a cloth, a tissue, etc. The motion controller 26 first operates the wiper actuator 37 to move the wiper 36 into contact with, or just close to, the nozzle distal end 87. Thereafter, the motion controller 26 operates the one of the solenoids 120-124 providing the high assist air pressure, that is, a fluid pressure greater than a pressure used for dispensing the conformal coating material. The resulting blast of high pressure assist air blows conformal coating material off of the nozzle distal end 87 and into the wiper 36. The motion controller 26 then operates the wiper actuator 37 to move the wiper 36 away from the nozzle distal end 87 to a non-interfering location.

Further, a needle guide 78 is used with the described embodiment; however, as will be appreciated, in some applications, the needle guide 78 can be omitted.

Therefore, the inventions in their broadest aspects are not limited to the specific details shown and described. Consequently, departures may be made from the details described herein without departing from the spirit and scope of the claims that follow.

What is claimed is:

1. A method of dispensing a coating material onto a substrate using an applicator comprising:
   a body comprising a liquid flow passage for receiving the coating material and a fluid passage for receiving a pressurized fluid,
   an extension connected to the body,
   a nozzle attached to the extension and including a dispensing orifice,
   a dispensing valve operable by a control to dispense the coating material through the dispensing orifice onto a substrate, and
   a cap surrounding the nozzle and forming a fluid path conducting the pressurized fluid,
   the method comprising:
   initiating a flow of pressurized fluid along the fluid path and through spaces between splines in the fluid path upstream of a distal end of the cap, the splines extending outward from the extension and having respective lengths extending parallel to a nozzle axial centerline;
   opening the dispensing valve to initiate a flow of coating material from the dispensing orifice; and
   discharging the pressurized fluid in a direction substantially parallel to the nozzle axial centerline, the pressurized fluid contacting the flow of coating material to form a randomized monofilament pattern of coating material on the substrate.

2. The method of claim 1 wherein the dispensing orifice is positioned downstream of the distal end of the cap and the method further comprises discharging the pressurized fluid through an annular fluid outlet formed between the distal end of the cap and the nozzle.

3. The method of claim 1 wherein one end of the extension is attachable to the body and the splines are formed in an opposite end of the extension.

4. The method of claim 3 wherein the nozzle is mountable to the opposite end of the extension.

5. A method of dispensing a coating material onto a substrate using an applicator comprising:
   a body comprising a liquid flow passage for receiving the coating material and a fluid passage for receiving a pressurized fluid,
   a nozzle including a dispensing orifice,
   a dispensing valve operable by a control to dispense the coating material through the dispensing orifice onto a substrate,
   a cap including an inner surface, surrounding the nozzle, and forming a fluid path conducting the pressurized fluid, and
   splines in the fluid path having respective lengths extending parallel to a nozzle axial centerline,
   the method comprising:
   moving an inner surface of the cap into contact with the splines to align the cap with the nozzle;
   initiating a flow of pressurized fluid along the fluid path and through spaces between the splines in the fluid path upstream of a distal end of the cap;
   opening the dispensing valve to initiate a flow of coating material from the dispensing orifice; and
   discharging the pressurized fluid in a direction substantially parallel to the nozzle axial centerline, the pressurized fluid contacting the flow of coating material to form a randomized monofilament pattern of coating material on the substrate.

6. The method of claim 5 wherein moving the inner surface of the cap into contact with the splines aligns the cap substantially coaxially with the dispensing orifice.

7. The method of claim 5 wherein the dispensing orifice is positioned downstream of the distal end of the cap and the method further comprises discharging the pressurized fluid through an annular fluid outlet formed between the distal end of the cap and the nozzle.

8. A method of dispensing a coating material onto a substrate using an applicator comprising:
- a body comprising a liquid flow passage for receiving the coating material and a fluid passage for receiving a pressurized fluid,
- an extension connected to the body,
- a nozzle including a dispensing orifice and mounted on the extension,
- a dispensing valve operable by a control to dispense the coating material through the dispensing orifice onto a substrate, and
- a cap surrounding the nozzle and forming a fluid path conducting the pressurized fluid, the method comprising:
- initiating a flow of pressurized fluid along the fluid path and through spaces between splines in the fluid path upstream of a distal end of the cap, the splines extending outward from the extension and having respective lengths extending oblique to a nozzle axial centerline;
- opening the dispensing valve to initiate a flow of coating material from the dispensing orifice; and
- discharging the pressurized fluid in a direction oblique to the nozzle axial centerline, the pressurized fluid contacting the flow of coating material to form a rotational monofilament pattern of coating material on the substrate.

9. The method of claim 8 wherein the dispensing orifice is positioned downstream of the distal end of the cap and the method further comprises discharging the pressurized fluid through an annular fluid outlet formed between the distal end of the cap and the nozzle.

10. A method of dispensing a coating material onto a substrate using an applicator comprising:
- a body comprising a liquid flow passage for receiving the coating material and a fluid passage for receiving a pressurized fluid,
- a nozzle including a dispensing orifice,
- a dispensing valve operable by a control to dispense the coating material through the dispensing orifice onto a substrate,
- a cap including an inner surface, surrounding the nozzle, and forming a fluid path conducting the pressurized fluid, and
- splines in the fluid path having respective lengths extending oblique to a nozzle axial centerline, the method comprising:
- moving an inner surface of the cap into contact with the splines to align the cap with the nozzle;
- initiating a flow of pressurized fluid along the fluid path and through spaces between the splines in the fluid path upstream of a distal end of the cap;
- opening the dispensing valve to initiate a flow of coating material from the dispensing orifice; and
- discharging the pressurized fluid in a direction oblique to the nozzle axial centerline, the pressurized fluid contacting the flow of coating material to form a rotational monofilament pattern of coating material on the substrate.

11. The method of claim 10 wherein moving the inner surface of the cap into contact with the splines aligns the cap substantially coaxially with the dispensing orifice.

12. The method of claim 10 wherein the dispensing orifice is positioned downstream of the distal end of the cap and the method further comprises discharging the pressurized fluid through an annular fluid outlet formed between the distal end of the cap and the nozzle.

\* \* \* \* \*